(12) United States Patent
Xiao et al.

(10) Patent No.: US 9,871,508 B2
(45) Date of Patent: Jan. 16, 2018

(54) SMART SWITCH FOR CONNECTING AN INPUT POWER SUPPLY TO A LOAD

(71) Applicants: Ying Xiao, Santa Clara, CA (US); Rohan Samsi, Milpitas, CA (US); Jinghai Zhou, Cupertino, CA (US)

(72) Inventors: Ying Xiao, Santa Clara, CA (US); Rohan Samsi, Milpitas, CA (US); Jinghai Zhou, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 353 days.

(21) Appl. No.: 14/664,579

(22) Filed: Mar. 20, 2015

(65) Prior Publication Data

US 2016/0182039 A1 Jun. 23, 2016

Related U.S. Application Data

(60) Provisional application No. 62/094,851, filed on Dec. 19, 2014.

(51) Int. Cl.
 *H03K 17/18* (2006.01)
(52) U.S. Cl.
 CPC ..... *H03K 17/18* (2013.01); *H03K 2217/0009* (2013.01)
(58) Field of Classification Search
 CPC .... H03K 17/002; H03K 17/08; H03K 17/082; H03K 17/0822; H03K 17/18
 USPC ........ 307/112, 113, 115, 116, 125, 131, 139, 307/143
 See application file for complete search history.

(56) References Cited

U.S. PATENT DOCUMENTS

| | | | | |
|---|---|---|---|---|
| 4,929,884 A | * | 5/1990 | Bird | G05F 3/24 257/E27.064 |
| 5,119,312 A | * | 6/1992 | Groger | H01H 47/002 361/101 |
| 7,339,772 B2 | | 3/2008 | Ochi | |
| 7,384,276 B2 | | 6/2008 | Lee | |
| 7,821,753 B2 | | 10/2010 | Evans et al. | |
| 8,493,734 B2 | | 7/2013 | Chien et al. | |
| 8,645,753 B2 | | 2/2014 | Yang et al. | |
| 9,467,136 B1 | * | 10/2016 | Nguyen | H03K 17/0822 |
| 2002/0159276 A1 | * | 10/2002 | Deboy | H02M 3/33507 363/20 |
| 2005/0189965 A1 | * | 9/2005 | Tihanyi | H03K 17/302 327/108 |
| 2011/0157756 A1 | * | 6/2011 | Zanardi | H03K 17/0822 361/94 |

(Continued)

OTHER PUBLICATIONS

MAX15090/MAX15090A 2.7V to 18V, 12A, Hot-Swap Solution with Current Report Output, Rev.2, Sep. 2013, pp. 1-15, maxim integrated.

*Primary Examiner* — William Hernandez
(74) *Attorney, Agent, or Firm* — Okamoto & Benedicto LLP

(57) ABSTRACT

A monolithic integrated circuit (IC) switch device includes an input pin that receives an input power supply and an output pin that is connected to a load. The monolithic IC switch device includes driving circuitry that controls a switching operation of a power switch to connect and disconnect the input power supply to and from the load. A microcontroller can enable or disable the monolithic IC switch device based on indicator signals received by the microcontroller from the monolithic IC switch device.

16 Claims, 10 Drawing Sheets

(56) References Cited

U.S. PATENT DOCUMENTS

2014/0277802 A1* 9/2014 Tomas ..................... G06F 1/30
              700/292
2015/0030051 A1* 1/2015 Cortigiani ................ H02H 3/07
              374/137

* cited by examiner

SMART SWITCH FOR CONNECTING AN INPUT POWER SUPPLY TO A LOAD

CROSS-REFERENCE TO RELATED APPLICATION

This application claims the benefit of U.S. Provisional Application No. 62/094,851, filed on Dec. 19, 2014, which is incorporated herein by reference in its entirety.

BACKGROUND OF THE INVENTION

1. Field of the Invention

The present invention relates generally to integrated circuits, and more particularly but not exclusively to switches for electronic devices.

2. Description of the Background Art

Switches are employed in electronic devices to connect and disconnect an input power supply to a load. These switches are typically employed in removable circuit cards (e.g., add-on boards), hot-swap storage devices, and other applications involving connection of an input power supply to a load. A typical switch in such applications has a terminal connected to the input power supply and an opposing terminal connected to the load. As a particular example, the switch can be used to allow a hot-swap disk drive (the load in this example) to receive power from a power supply by way of a disk drive bay or motherboard. The switch can be implemented using a power transistor. The gate of the power transistor can be tied to a capacitor, which charges during startup. Once fully charged, the capacitor keeps the power transistor ON to allow the load to continuously receive the power supply voltage.

SUMMARY

In one embodiment, a monolithic integrated circuit (IC) switch device includes an input pin that receives an input power supply and an output pin that is connected to a load. The monolithic IC switch device includes driving circuitry that controls a switching operation of a power switch to connect and disconnect the input power supply to and from the load. A microcontroller can enable or disable the monolithic IC switch device based on indicator signals received by the microcontroller from the monolithic IC switch device.

In another embodiment, a plurality of monolithic IC switch devices are employed to receive the input power supply in parallel.

In another embodiment, the monolithic IC switch device is employed in standalone mode without a microcontroller.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
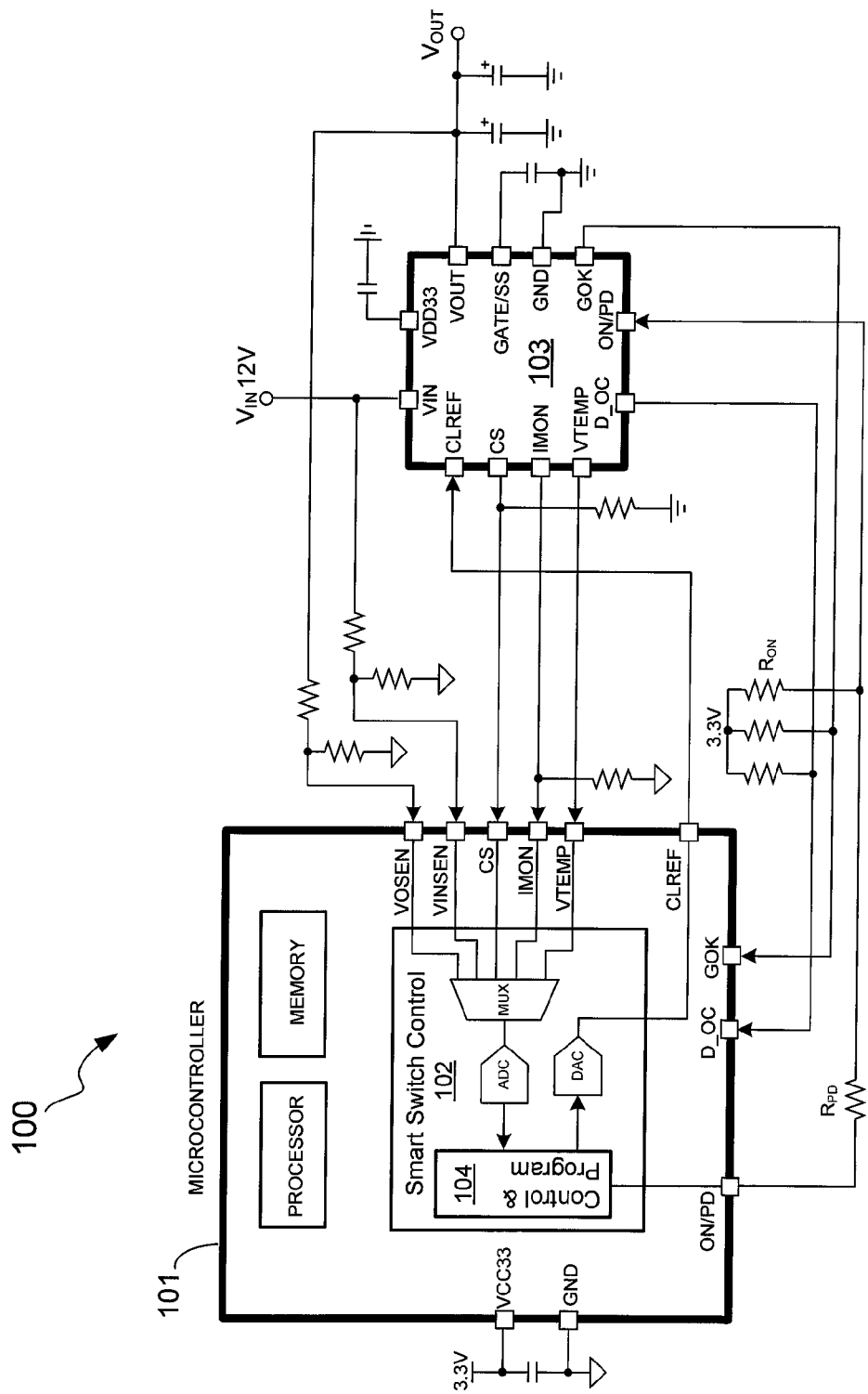
FIG. 1 shows a schematic diagram of a system for connecting an input power supply to a load in accordance with an embodiment of the present invention.

FIG. 1 shows a schematic diagram of a system 100 for connecting an input power supply to a load in accordance with an embodiment of the present invention. In the example of FIG. 1, the system 100 comprises a single-chip microcontroller 101 and a monolithic integrated circuit (IC) switch device 103. The switch device 103 is a "smart switch" in that it is controllable by a microcontroller and has integrated driving circuits for driving a power transistor and integrated monitoring circuits for providing switch and power supply conditions to the microcontroller.

In one embodiment, the switch device 103 is a monolithic IC in that it is a single-die chip. In the example of FIG. 1, the switch device 103 has a plurality of pins that includes a VIN pin for accepting an input power supply voltage $V_{IN}$ and a VOUT pin that is connected to a load. The switch device 103 can include a power switch (see FIG. 2, 201), such as a power field effect transistor (FET). The power switch can have a first terminal (e.g., drain) connected to the VIN pin and a second terminal (e.g., source) connected to the VOUT pin. The switch device 103 includes circuitry that drives the gate of the power switch for turning the power switch ON and OFF in a controlled manner. When turned ON, the power switch connects the input power supply that is connected to the VIN pin to the load that is connected to the VOUT pin. In the example of FIG. 1, the input power supply generates 12V at 60 A for illustration purposes. As can be appreciated, the system 100 can also be employed to connect other input power supplies with different voltage and current ratings to a load.

In the example of FIG. 1, the switch device 103 further includes a GOK pin for indicating a fault (e.g., over temperature, short circuit, power switch short fault), a GND pin for connecting the switch device 103 to signal ground, an ON/PD pin for enabling/disabling the switch device 103 or for placing the switch device 103 in pull-down mode, a D_OC pin for providing a digital over current indicator signal, a VTEMP pin for indicating the junction temperature (i.e., die temperature of the monolithic IC) of the switch device 103, an IMON pin for indicating the amount of output current of the switch device 103 (i.e., DC current flowing out from the VOUT pin), a current sense (CS) pin for providing another indicator of an amount of the output current of the switch device 103, a CLREF pin for receiving a current limit reference signal, a GATE or SS pin that accepts a capacitor for controlling the ramp rate of the turn ON of the power switch, and a VDD33 pin for outputting an internal (i.e., within the monolithic IC switch device 103) load dropout regulator (LDO) output voltage.

In the example of FIG. 1, the microcontroller 101 includes a smart switch control circuit 102 comprising a multiplexer (MUX), an analog to digital converter (ADC), a digital to analog converter (DAC), and a control and program logic 104 (e.g., firmware, programmable logic). The microcontroller 101 can enable or disable the switch device 103 based on conditions of the switch device 103. The microcontroller 101 can receive condition indicator signals (e.g., temperature, current sense, current monitor, fault) from the switch device 103. The microcontroller 101 can be any suitable generic microprocessor or other single-chip processor with integrated analog and digital input/output pins, configurable firmware, and/or data acquisition and processing features. The microcontroller 101 is "generic" in that it is not specially designed to work with the switch device 103 and includes generic microcontroller/microprocessor components, such as a processor and memory. Advantageously, the switch device 103 can be controlled by a generic microcontroller without necessarily requiring a specially designed, dedicated external controller to interface the switch device 103 to the microcontroller. The switch device 103 can be directly controlled by the microcontroller 101.

In the example of FIG. 1, the switch device 103 further includes a GOK pin for indicating a fault (e.g., over temperature, short circuit, power switch short fault), a GND pin for connecting the switch device 103 to signal ground, an ON/PD pin for enabling/disabling the switch device 103 or for placing the switch device 103 in pull-down mode, a D_OC pin for providing a digital over current indicator signal, a VTEMP pin for indicating the junction temperature (i.e., die temperature of the monolithic IC) of the switch device 103, an IMON pin for indicating the amount of output current of the switch device 103 (i.e., DC current flowing out from the VOUT pin), a current sense (CS) pin for providing another indicator of an amount of the output current of the switch device 103, a CLREF pin for receiving a current limit reference signal, a GATE or SS pin that accepts a capacitor for controlling the ramp rate of the turn ON of the power switch, and a VDD33 pin for outputting an internal (i.e., within the monolithic IC switch device 103) load dropout regulator (LDO) output voltage.

In the example of FIG. 1, the GOK and D_OC pins of the switch device 103 can output digital indicator signals that can be received by the microcontroller 101 through a digital input pin for processing by the control and program logic 104. In one embodiment, the signals output by the GOK and D_OC pins of the switch device 103 are digital, and thus can be processed by the control and program logic 104 without analog-to-digital conversion.

In the example of FIG. 1, the microcontroller 101 has a GOK pin that is coupled to the GOK pin of the switch device 103. A fault indicator signal from the GOK pin of the switch device 103 indicates whether the switch device 103 is operating properly or has a fault condition. The microcontroller 101 receives and processes the fault indicator signal from the GOK pin of the switch device 103 to control the switch device 103. For example, the microcontroller 101 can place the switch device 103 in pull down mode or disable the switch device 103 when the fault indicator signal indicates that there is something wrong with the switch device 103.

In the example of FIG. 1, the microcontroller 101 has an ON/PD pin that is coupled to the ON/PD pin of the switch device 103. The microcontroller 101 can enable the switch device 103 by sending an enable signal to the ON/PD pin of the switch device 103. In one embodiment, the switch device 103 is enabled, i.e., operable to connect the input power supply to the load, when the enable signal is asserted on the ON/PD pin of the switch device 103. The switch device 103 is disabled, i.e., disconnects the input power supply from the load, when the enable signal is not asserted. In one embodiment, the switch device 103 reverts to pull-down (PD) mode in which the switch device 103 pulls down the VOUT pin when the enable signal is held at a predetermined level for a predetermined amount of time.

In the example of FIG. 1, the control and program logic 104 can be configured to retrieve or determine a soft start current limit value. The control and program logic 104 can also change the current limit value at anytime of the operation based on sensed input power supply voltage VIN and output power supply voltage VOUT and/or based on system load conditioning requirements. The current limit value can be converted by the digital-to-analog converter of the smart switch control circuit 102 to a current limit reference signal in analog form, or be converted to a digital coding output, which will then be converted to an analog form by discrete components. The microcontroller 101 outputs the current limit reference signal (in analog or digital form) at its CLREF pin; the switch device 103 receives the current limit reference signal at its corresponding CLREF pin.

In the example of FIG. 1, the microcontroller 101 receives two supply current indicator signals from the switch device 103. The first supply current indicator signal is a current sense signal that is output by the switch device 103 on the CS pin. In one embodiment, the current sense signal is a current that is proportional to the output current. The current sense signal can be used for current balancing and over current protection. The second supply current indicator signal is a current monitor signal that is output by the switch device 103 on the IMON pin. In one embodiment, the current monitor signal is a voltage that is linearly proportional to the output current and is relatively small in magnitude (e.g., 0 to 1.6V). This makes the current monitor signal especially useful in allowing the microcontroller 101 to accurately detect the amount of current flowing through the power switch of the switch device 103.

For various reasons including safety, trouble shooting, load balancing, etc., it is advantageous to know the junction temperature of the switch device 103. Accordingly, in the example of FIG. 1, the microcontroller receives a temperature indicator signal indicating the junction temperature of the switch device 103. In one embodiment, the temperature indicator signal from the VTEMP pin of the switch device 103 is a voltage that is proportional to the junction temperature (e.g., 10 mV/° C.). The program and control logic 104 can take into account the junction temperature in deciding whether to disable the switch device 103, trigger an alarm, or report a fault condition, for example.

Figure 2:
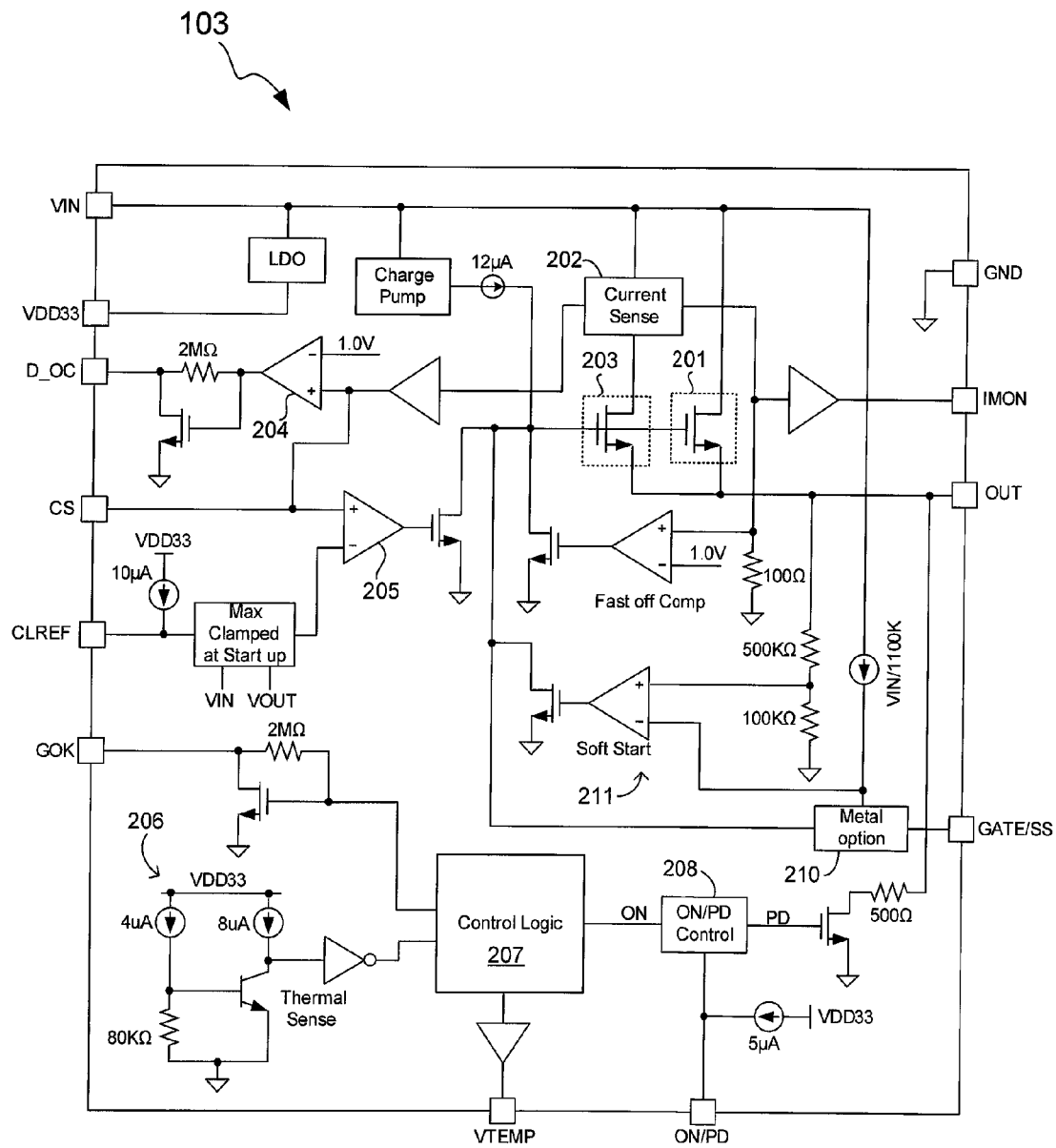
FIG. 2 shows a schematic diagram of a monolithic integrated circuit (IC) switch device in accordance with an embodiment of the present invention.

FIG. 2 shows a schematic diagram of a monolithic IC switch device 103 in accordance with an embodiment of the present invention. In the example of FIG. 2, the power switch 201 of the switch device 103 is a power field effect transistor (FET). A current sense circuit 202 senses the current flowing from the VIN pin to the VOUT pin. The current sense circuit 202 outputs a corresponding current sense signal at the CS pin and a corresponding current monitor signal at the IMON pin. A transistor 203 (e.g., a FET), which can be sized much smaller than the power switch 201 (e.g., 1/10000 in size), is in parallel with the power switch 201 for current sensing. The current sense signal voltage is compared to a threshold voltage by the comparator 204 to detect an overcurrent, which is condition indicated on the D_OC pin as a digital overcurrent indicator. The switch device 103 receives a current limit reference signal voltage at its CLREF pin, which is compared by the amplifier 205 to the current sense signal voltage to control the gate of the power switch 201 and thereby limit in-rush current during startup, such in applications where a circuit card is inserted into a live (i.e., powered up) backplane. Similarly, the output of amplifier 205 can control the gate of the power switch 201 to limit load current that may be drawn from the input pin to the output pin during normal operation or power saving mode. In one embodiment, the amplifier 205 is an operational transconductance amplifier (OTA).

In the example of FIG. 2, a low dropout regulator (LDO) receives the input power supply voltage $V_{IN}$ at the VIN pin and generates a supply voltage on the VDD33 pin (e.g., 3.3V output). A thermal sense circuit 206 senses the junction temperature of the switch device 103 for the control logic 207, which outputs a corresponding junction temperature indicator signal at the VTEMP pin. In one embodiment, the control logic 207 implements an over temperature latch that shuts down the switch device 103 when the junction temperature reaches a threshold junction temperature limit (e.g., 145° C.).

In one embodiment, the control logic 207 outputs a fault indicator signal at the GOK pin to indicate a short circuit, power switch 201 short or open, over temperature, or other fault condition. The GOK pin can be an open drain output during normal operation and pulled LOW by the control logic 207 when a fault is detected. An enable signal from the microcontroller 101 can be received on the ON/PD pin of the switch device 103 by an ON/PD control circuit 208, which passes the enable signal to the control logic 207. The control logic 207 turns OFF the power switch 201 to disconnect the input power supply from the load when the enable signal is not asserted. In one embodiment, the ON/PD control circuit 208 pulls down the VOUT pin when the enable signal is held at a predetermined level for a predetermined amount of time.

In the example of FIG. 2, a metal option (see 210) allows the GATE/SS pin to be connected directly to the gate of the power switch 201 or to a soft start circuit 211. When the GATE/SS pin is metal optioned to directly connect to the gate of the power switch 201, a capacitor can be connected to the GATE/SS pin to reduce inrush current during startup. When the GATE/SS pin is metal optioned to connect to the soft start circuit 211, the capacitance of the capacitor connected to the GATE/SS pin determines the soft start time.

Figure 3:
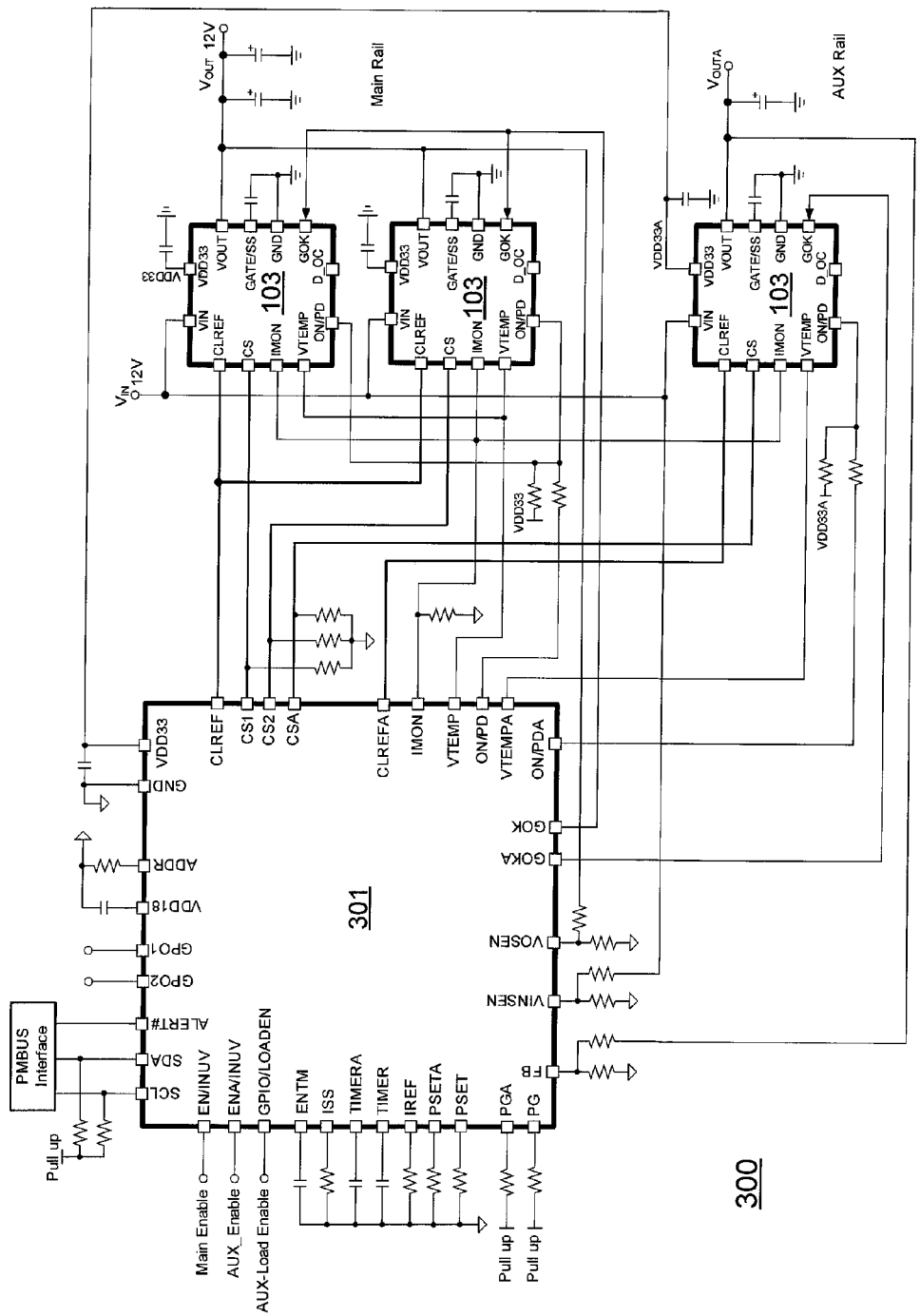
FIG. 3 shows a schematic diagram of a system for connecting an input power supply to one or more loads in accordance with an embodiment of the present invention.

FIG. 3 shows a schematic diagram of a system 300 for connecting an input power supply to one or more loads in accordance with an embodiment of the present invention. In the example of FIG. 3, a single input power supply that provides an input power supply voltage $V_{IN}$ is connected in parallel to a plurality of switch devices 103. Current sense signals from the switch devices 103 are separately received by the microcontroller 301 for individual control and diagnostics.

In the example of FIG. 3, the current monitor signals from the switch devices 103 can be received individually by the microcontroller 301. The current monitor signals can also be tied together or in groups for input to the microcontroller 301. The same can be done for the temperature indicator signals. In the example of FIG. 3, the microcontroller 301 has sufficient integrated digital and analog I/O ports and data acquisition components to accommodate the multiple switch devices 103.

In the example of FIG. 3, two switch devices 103 (top and middle) form a group that receives the input power supply in parallel to provide a combined power supply output (Main Rail) at the tied VOUT pins of the switch devices 103. A separate switch device 103 (bottom) is also in parallel to receive the input power supply, but provides a separate power supply output (AUX rail). This allows for generating two output power supply voltages $V_{OUT}$ and $V_{OUTA}$ from a single input power supply voltage $V_{IN}$.

Providing at least two supply current indicators to the microcontroller 301 is especially advantageous in parallel configurations because each switch device 103 can provide separate current sense signals to the microcontroller 301 for individual current limit programming. In the example of FIG. 3, current sense signals from the CS pins of the switch devices 103 are separately provided to and received by the microcontroller 301. Current monitor signals from IMON pins of two or more switch devices 103 can be combined together to allow the microcontroller 301 to determine the total output current of a group of switch devices 103. This is exemplified in FIG. 3, where the IMON pins of the switch devices 103 are tied together to provide the microcontroller 301 a combined current monitor signal that indicates the total output current; the combined current monitor signal is received in a single IMON pin of the microcontroller 301.

Figure 4:
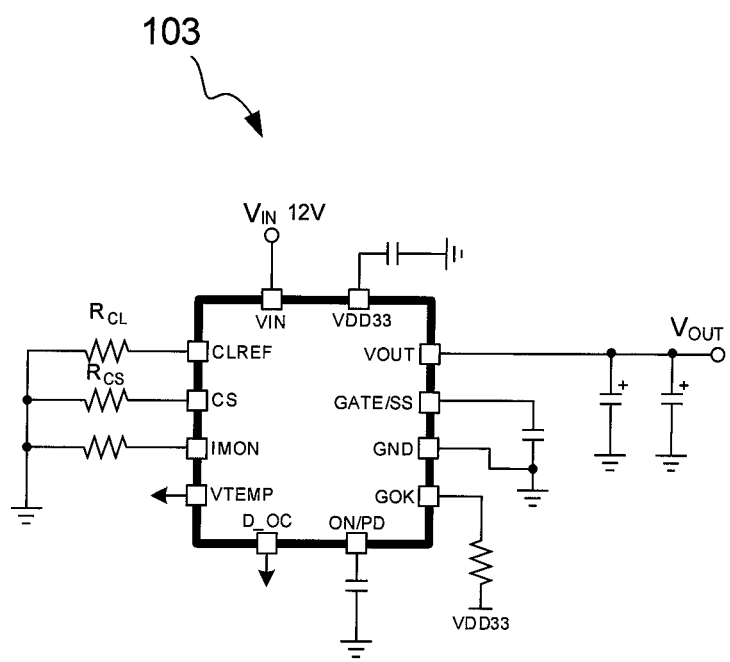
FIG. 4 shows a schematic diagram of a monolithic IC switch device in standalone mode in accordance with an embodiment of the present invention.

FIG. 4 shows a schematic diagram of a switch device 103 in standalone mode (i.e., not controlled by a microcontroller) in accordance with an embodiment of the present invention. In the example of FIG. 4, the GATE/SS pin of the switch device 103 can be tied to a capacitor to control the degree of conduction of the power switch for soft start. The CS pin can be tied to a resistor RCS to program the over current flag (D_OC) current level and the maximum allowable DC output current through the power switch 201 (see FIG. 2). The over current flag reference level is determined by the switch device 103. The maximum allowable current limit reference level can be implemented by connecting a resistor RCL on the CLREF pin. In one embodiment, where an internal 10 µA current source drives the CLREF pin, 10 µA×RCL defines the maximum current limit. For example, in the case where the CLREF voltage is set at 1.4V, when the resistor RCS multiplied by the current sense signal becomes higher than 1.4V, the output current exceeding the programmed maximum allowable DC output current can be clamped down at 1.4V. When the over current condition lasts longer than a predefined time, the switch device 103 will be shut down. During soft start, the current limit reference can be automatically adjusted to a lower level to control the ramp and for safe operation.

Figure 5:
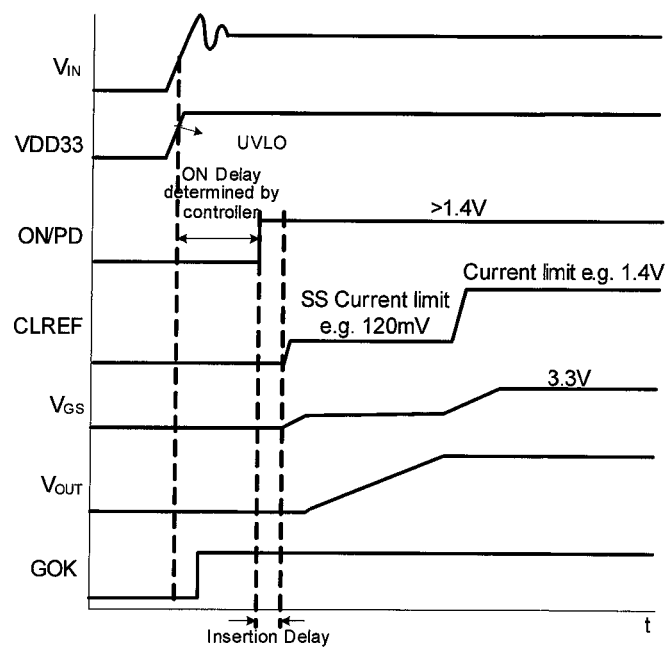
FIG. 5 shows waveforms illustrating startup sequences of a monolithic IC switch device in accordance with an embodiment of the present invention.

FIG. 5 shows waveforms illustrating startup sequences of the switch device 103 in accordance with an embodiment of the present invention. For hot-swap applications, the VIN pin of the switch device 103 can experience a voltage spike or transient during the hot-swap procedure, such as when a circuit card that incorporates the switch device 103 is inserted into a live backplane. The voltage spike or transient is typically caused by parasitic inductance of an input trace and an input capacitor on the VIN pin. When the switch device 103 is configured to work with a microcontroller (e.g., see FIG. 1), the ON/PD pin may be pulled LOW by the microcontroller to turn OFF the power switch 201 for an insertion delay time to stabilize the input power supply voltage $V_{IN}$. The ON/PD pin may be driven HIGH to enable the power switch 201 to turn ON after expiration of the delay time.

As shown in FIG. 5, the input power supply voltage $V_{IN}$ increases at a relatively fast rate. Accordingly, the gate of the switch device 103 can be pulled LOW by the internal control circuitry of 103 during plug-in of an input power supply voltage $V_{IN}$ with high rate of change (i.e., high dv/dt). The switch device 103 internal LDO output at the VDD33 pin ramps up along with the input power supply voltage $V_{IN}$.

When the switch device 103 works in conjunction with a microcontroller, the microcontroller can be powered up by the LDO output at the VDD33 pin or by an external 3.3V power supply. The power switch 201 of the switch device 103 is turned OFF until the enable signal on the ON/PD pin is pulled to HIGH by the microcontroller. When the enable signal becomes HIGH, the power switch 201 is charged up by an internal charge pump. Once the VGS voltage of the power switch 201 reaches its threshold VGSTH, then the output voltage rises.

Figure 6:
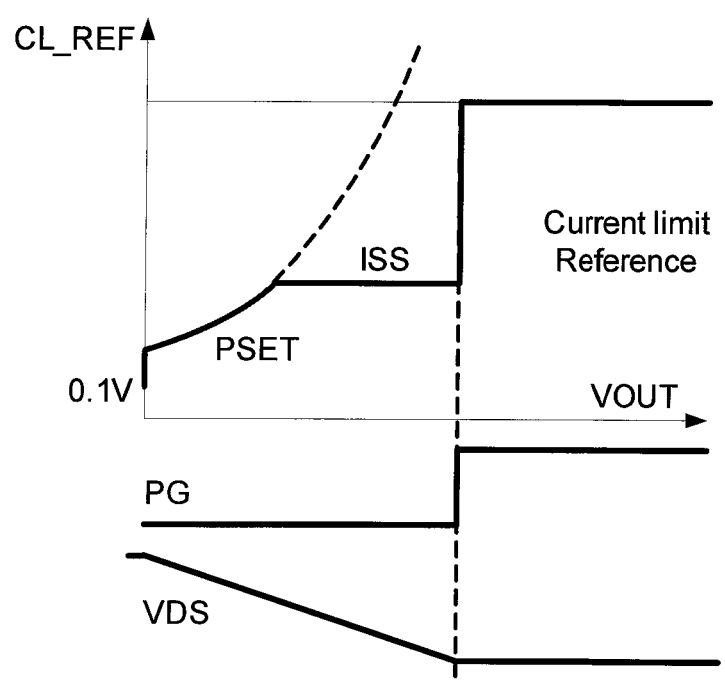
FIGS. 6 and 7 show controlled power up waveforms by power limit and current limit of a monolithic IC switch device in accordance with an embodiment of the present invention.
Figure 7:
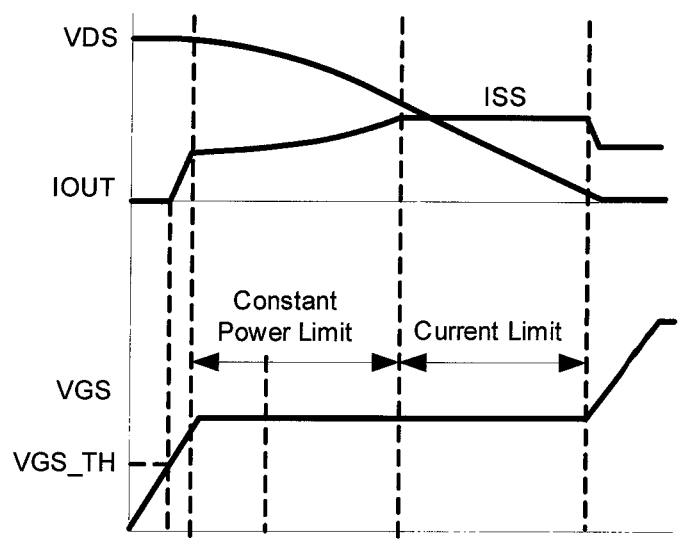

FIGS. 6 and 7 show controlled power up waveforms by power limit and soft start current limit of the switch device 103 in accordance with an embodiment of the present invention. The output current of the switch device 103 can be limited by a current limit reference signal at the CLREF input pin for soft start. In one embodiment, the current sense signal voltage present at the CS pin is compared by the amplifier 205 (see FIG. 2) to the current limit reference signal voltage present at the CLREF pin to regulate the gate of the power switch 201 and prevent the output current from exceeding the current limit defined by the current limit reference signal. The current limit reference signal voltage should be set at a lower level during start up to allow for a controlled gradual ramp up of the output voltage $V_{OUT}$. The current limit reference signal can thereafter be raised to full current limit once the output voltage $V_{OUT}$ has ramped close to the input power supply voltage $V_{IN}$, the gate of the power switch 201 is fully enhanced, and the system is ready to draw power from the input power supply.

To protect the switch device 103 from overheating during start up, a maximum power limit can be included during start up. In one embodiment, the current limit reference signal at the CLREF pin has an internal maximum clamp that depends on Vin–Vout. When Vout<30% Vin, the current limit reference signal is clamped at 200 mV; when 30% VIN<VOUT<80% VIN, the current limit reference signal is clamped at 600 mV; when 80% VIN<Vout, the current limit reference signal is not clamped.

In one embodiment, the ON/PD pin of the switch device 103 can be used to control the turning ON/OFF of the power switch 201 or to select output voltage pull down mode. For example, when the ON/PD pin is used to turn the power switch 201 ON/OFF, the power switch 201 will be turned ON when the enable signal voltage on the ON/PD pin is higher than 1.4V and the power switch 201 will be turned OFF when the enable signal voltage on the ON/PD pin is lower than 1.2V. When the ON/PD pin is used for output voltage $V_{OUT}$ pull down mode control, the voltage at the ON/PD pin can be clamped to around 1V for longer than 200 us, and the switch device 103 can be configured to enter pull down mode when the ON/PD pin voltage is between 0.8V and 1.2V for 200 μs, for example.

Figure 8:
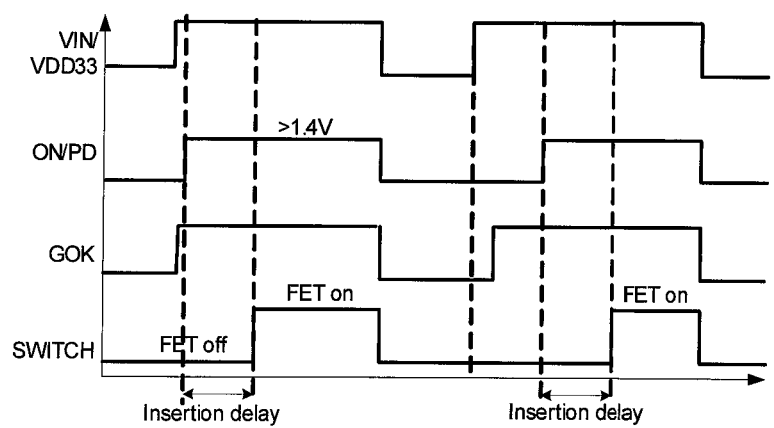
FIG. 8 shows waveforms illustrating power switch ON/OFF control when no fault happens in a monolithic IC switch device in accordance with an embodiment of the present invention.

In one embodiment, the ON/PD control circuit 208 (see FIG. 2) has a fixed 1 ms blanking time after the LDO output voltage and the input power supply voltage $V_{IN}$ becomes higher than the under voltage lockout (UVLO) threshold or after the ON PD control logic becomes HIGH, whichever occurs last. All fault functionality is operative during the blanking time so that a fault indicator signal at the GOK pin is pulled to HIGH if no fault is detected or is kept LOW if a fault is detected. The HIGH level signal at the ON/PD pin during the blanking time will not turn ON the power switch 201. At the end of the blanking time, the ON/PD pin allows for normal mode to turn ON the power switch 201 if no fault is detected. Once the ON/PD pin is pulled to a level higher than 1.4V and the blanking time ends, an internal current source charges the gate of the power switch 201. Once the gate voltage reaches its threshold $V_{GSTH}$, then the output voltage $V_{OUT}$ rises. The output voltage $V_{OUT}$ rises following the CLREF controlled current limit reference signal and output capacitor. FIG. 8 shows waveforms illustrating power switch ON/OFF control when no fault happens in the switch device 103 in accordance with an embodiment of the present invention.

In one embodiment, the ON/PD pin is pulled HIGH internally with a 5 μA internal pull-up current source. When the switch device 103 works standalone (i.e., without a microcontroller), an external capacitor can be connected from the ON/PD pin to ground. The internal 5 μA current source charges the external capacitor during start up to realize a programmable insertion delay. Once the voltage at the ON/PD pin reaches its turning ON threshold, then the power switch 201 can be turned ON.

Figure 9:
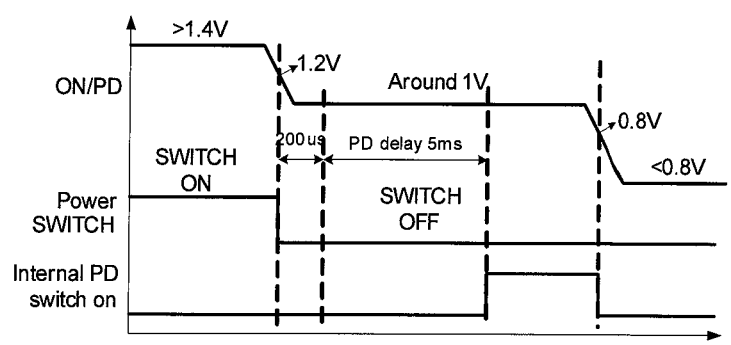
FIG. 9 shows waveforms illustrating pull down mode control of a monolithic IC switch device in accordance with an embodiment of the present invention.

FIG. 9 shows waveforms illustrating pull down mode control of the switch device 103 in accordance with an embodiment of the present invention. In one embodiment, when the voltage on the ON/PD pin is set to around 1V for more than 200 us, the switch device 103 will work in pull down mode. In this mode, when the power switch 201 is turned OFF, an integrated pull down source (resistor or power switch) attached to the output discharges the output after a fixed delay time of 5 ms. If the signal on the ON/PD pin is pulled to LOW directly, pull-down mode is disabled and the output voltage discharges through an external load.

Figure 10:
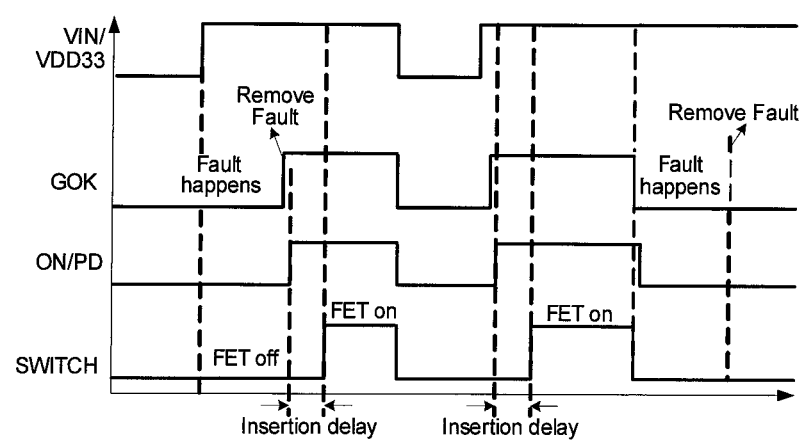
FIG. 10 shows waveforms illustrating power switch ON/OFF control with fault indication from a monolithic IC switch device in accordance with an embodiment of the present invention.

FIG. 10 shows waveforms illustrating power switch ON/OFF control with fault indication from the GOK pin of the switch device 103 in accordance with an embodiment of the present invention. In one embodiment, the fault indicator signal from the GOK pin is an open-drain, active low signal for reporting a fault of the switch device 103. When a fault has occurred, the GOK pin will be pulled low. The GOK pin is pulled up to the LDO output voltage, i.e., the voltage at the VDD33 pin, through a 100 kΩ resistor. The GOK pin output is driven LOW during the LDO output voltage power-up.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A system comprising:
    a monolithic integrated circuit (IC) switch device, the monolithic IC switch device comprising a first pin that receives an input power supply, a second pin connected to a load, a third pin that receives an enable signal that enables a power switch in the monolithic IC switch device to connect the first pin to the second pin, a fourth pin that outputs a temperature signal indicating a junction temperature of the monolithic IC switch device, a fifth pin that outputs a first supply current indicator signal indicative of an output current of the monolithic IC switch device, and a sixth pin that outputs a second supply current indicator signal indicative of the output current of the monolithic IC switch device; and a microcontroller having a processor and memory, the microcontroller connected to the fourth, fifth, and sixth pins of the monolithic IC switch device and controls operation of the monolithic IC switch device based on signals received by the microcontroller from the fourth, fifth, and sixth pins of the monolithic IC switch device.

2. The system of claim 1, wherein the monolithic IC switch device further comprises a seventh pin that outputs a fault indicator signal that is received and processed by the microcontroller to control the operation of the monolithic IC switch device.

3. The system of claim 1, wherein the power switch comprises a power transistor that is controllable to connect and disconnect the first pin to the second pin.

4. The system of claim 3, wherein the power transistor is a power field effect transistor (FET).

5. The system of claim 4, wherein a drain of the power FET is connected to the first pin and a source of the power FET is connected to the second pin.

6. The system of claim 1, further comprising another monolithic IC switch device that receives the input power supply in parallel with the monolithic IC switch device.

7. A method comprising:
receiving an input power supply at a first pin of a monolithic integrated circuit (IC) switch device;
coupling the input power supply at the first pin to a second pin of the monolithic IC switch device by way of a power switch in the monolithic IC switch device;
receiving an enable signal at a fourth pin of the monolithic IC switch device to enable or disable the power switch;
outputting a first current indicator signal that is indicative of an output current of the monolithic IC switch device at a sixth pin of the monolithic IC switch device; and
outputting a second current indicator signal that is indicative of the output current of the monolithic IC switch device at a seventh pin of the monolithic IC switch device.

8. The method of claim 7, further comprising:
disabling the power switch in accordance with the enable signal for a delay time when the input power supply is initially connected to the first pin and thereafter enabling the power switch in accordance with the enable signal after expiration of the delay time.

9. The method of claim 7, further comprising:
receiving a current limit reference signal at a fifth pin of the monolithic IC switch device; and
limiting current through the power switch in accordance with the current limit reference signal.

10. The method of claim 7, further comprising:
combining the first current indicator signal with another current indicator signal from another monolithic IC switch device to generate a combined current indicator signal.

11. The method of 10, further comprising:
receiving the combined current indicator signal at a pin of a single-chip microcontroller.

12. The method of claim 10, further comprising:
receiving the combined current indicator signal at a pin of a single-chip microcontroller; and
receiving the second current indicator signal at another pin of the single-chip microcontroller.

13. A system comprising:
a monolithic integrated circuit (IC) switch device that receives an input power supply at a first pin of the monolithic IC switch device, couples the input power supply at the first pin to a second pin of the monolithic IC switch device by way of a power switch in the monolithic IC switch device, receives a capacitance at a third pin coupled to the gate of the power switch, controls a switching operation of the power switch, and disables or enables the power switch in accordance with an enable signal at a fourth pin of the monolithic IC switch device; and
a single-chip microcontroller that sends the enable signal to the monolithic IC switch device,
wherein the monolithic IC switch device outputs a first current indicator signal that is indicative of an output current of the monolithic IC switch device at a sixth pin of the monolithic IC switch device, and
wherein the monolithic IC switch device outputs a second current indicator signal that is indicative of the output current of the monolithic IC switch device at a seventh pin of the monolithic IC switch device.

14. The system of claim 13, wherein the monolithic IC switch device disables the power switch in accordance with the enable signal for a delay time when the input power supply is initially connected to the first pin of the monolithic IC switch device and thereafter enables the power switch in accordance with the enable signal after expiration of the delay time.

15. The system of claim 13, wherein the monolithic IC switch device receives a current limit reference signal at a fifth pin of the monolithic IC switch device, and limits a current through the power switch in accordance with the current limit reference signal.

16. The system of claim 13, wherein the single-chip microcontroller receives, on a same pin of the single-chip microcontroller, the first current indicator signal and another current indicator signal from another monolithic IC switch device.

* * * * *